United States Patent
Chin et al.

(10) Patent No.: US 10,334,734 B2
(45) Date of Patent: Jun. 25, 2019

(54) CIRCUIT ASSEMBLY AND ELECTRICAL JUNCTION BOX

(71) Applicants: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

(72) Inventors: Tou Chin, Mie (JP); Arinobu Nakamura, Mie (JP)

(73) Assignees: AutoNetworks Technologies, Ltd., Yokkaichi, Mie (JP); Sumitomo Wiring Systems, Ltd., Yokkaichi, Mie (JP); Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 15/759,604

(22) PCT Filed: Aug. 30, 2016

(86) PCT No.: PCT/JP2016/075287
§ 371 (c)(1),
(2) Date: Mar. 13, 2018

(87) PCT Pub. No.: WO2017/047373
PCT Pub. Date: Mar. 23, 2017

(65) Prior Publication Data
US 2019/0045635 A1    Feb. 7, 2019

(30) Foreign Application Priority Data
Sep. 15, 2015    (JP) .................................. 2015-181828

(51) Int. Cl.
*H05K 3/34*    (2006.01)
*H02G 3/16*    (2006.01)
(Continued)

(52) U.S. Cl.
CPC ............... *H05K 1/186* (2013.01); *H02G 3/03* (2013.01); *H02G 3/16* (2013.01); *H05K 1/0203* (2013.01);
(Continued)

(58) Field of Classification Search
None
See application file for complete search history.

(56) References Cited

U.S. PATENT DOCUMENTS 5,373,418 A * 12/1994 Hayasi ................ H01L 23/4006
257/718
6,518,868 B1 * 2/2003 Miller ...................... G06F 1/20
336/55
(Continued)

FOREIGN PATENT DOCUMENTS

JP    H05-327166 A    12/1993
JP    H07-254775 A    10/1995
(Continued)

OTHER PUBLICATIONS

Search Report for PCT/JP2016/075287, dated Nov. 22, 2016.

*Primary Examiner* — Xanthia C Cunningham
(74) *Attorney, Agent, or Firm* — Honigman LLP

(57) ABSTRACT

A circuit assembly includes a circuit board provided with a connection opening, a plurality of busbars provided on a back surface of the circuit board, an electronic component provided with connection terminals that are soldered to the corresponding busbar exposed through the connection opening, and a solder restricting layer that is provided between the circuit board and the plurality of busbars and includes a pattern surrounding a soldering region of the busbar to which the connection terminals are soldered.

8 Claims, 13 Drawing Sheets

(51) Int. Cl.
  *H05K 1/18* (2006.01)
  *H05K 7/14* (2006.01)
  *H02G 3/03* (2006.01)
  *H05K 1/02* (2006.01)

(52) U.S. Cl.
  CPC ......... *H05K 3/3452* (2013.01); *H05K 3/3494* (2013.01); *H05K 7/1432* (2013.01); *H05K 2201/066* (2013.01); *H05K 2201/10166* (2013.01); *H05K 2201/10272* (2013.01); *H05K 2201/10409* (2013.01)

(56) References Cited

U.S. PATENT DOCUMENTS

| | | | |
|---|---|---|---|
| 6,724,631 B2 * | 4/2004 | Ye | H01L 23/36 257/707 |
| 7,310,233 B2 * | 12/2007 | Bell | H05K 7/20509 165/185 |
| 7,576,988 B2 * | 8/2009 | Schwarz | H05K 7/20454 361/704 |
| 8,929,078 B2 * | 1/2015 | Weeber | H01L 23/552 165/80.3 |
| 9,555,828 B2 * | 1/2017 | Tashima | B62D 5/0406 |
| 10,206,309 B2 * | 2/2019 | Yang | H05K 5/0047 |
| 2002/0195262 A1 * | 12/2002 | Kirchberger | H02M 7/003 174/521 |
| 2009/0103267 A1 * | 4/2009 | Wieland | H05K 7/20409 361/707 |
| 2011/0228498 A1 * | 9/2011 | Kawai | H05K 7/20854 361/752 |
| 2012/0057318 A1 * | 3/2012 | Oota | H05K 5/006 361/753 |

FOREIGN PATENT DOCUMENTS

| | | |
|---|---|---|
| JP | H08-250625 A | 9/1996 |
| JP | 2004-147416 A | 5/2004 |

* cited by examiner

CIRCUIT ASSEMBLY AND ELECTRICAL JUNCTION BOX

CROSS-REFERENCE TO RELATED APPLICATIONS

This application is the U.S. national stage of PCT/JP2016/075287 filed Aug. 30, 2016, which claims priority of Japanese Patent Application No. JP 2015-181828 filed Sep. 15, 2015.

TECHNICAL FIELD

This specification relates to a circuit assembly and an electrical junction box provided with the circuit assembly, and specifically to a technique for soldering an electronic component in a circuit board provided in a circuit assembly to a busbar.

BACKGROUND

The technique for soldering an electronic component to a busbar disclosed in JP 2004-147416A, for example, is known as a conventional technique for soldering an electronic component to a busbar. JP 2004-147416A discloses a technique for providing a punched portion of a busbar constituted by a slit or a small hole that is to be located on the outside of and along the outer edge of a connection terminal provided on the back side of an electronic component such as a semiconductor switching element in order to restrict the spread of solder and position the electronic component on a proper installing surface with high accuracy when the electronic component is soldered to the busbar. At that time, the punched portion blocks the spread of paste-like solder applied to the terminal installing surface of the busbar. The solder is thus bulged due to surface tension, and the bulged solder is pressed onto the outer surface of the terminal. As a result, the electronic component is installed on the busbar without being shifted from the proper installing position.

However, with the above-mentioned conventional technique, the electronic component can be installed on the busbar without being shifted from the proper installing position, whereas a space in which the punched portion constituted by a slit or a small hole is to be provided is required on the busbar. Therefore, this is disadvantageous for a further reduction in size of a circuit assembly. Moreover, the surface tension of solder is utilized, and therefore, it is not easy to restrict the spread of solder with high accuracy.

The technique disclosed in this specification was accomplished based on the above-mentioned circumstances, and, according to this specification, a circuit assembly with which the spread of solder can be restricted with high accuracy when an electronic component is soldered to a busbar is provided, while the size of the circuit assembly can be further reduced.

SUMMARY

A circuit assembly disclosed in this specification includes a circuit board provided with a connection opening, a plurality of busbars provided on a back surface of the circuit board, an electronic component provided with a connection terminal that is soldered to the corresponding busbar exposed through the connection opening, and a solder restricting layer that is provided between the circuit board and the plurality of busbars and includes a pattern surrounding a soldering region of the busbar to which the connection terminal is soldered.

With this configuration, when the connection terminal of the electronic component is soldered to the soldering region of the busbar, the spread of solder outward from the soldering region can be restricted by the pattern of the solder restricting layer surrounding the soldering region. For example, a commonly used sticky sheet, adhesive sheet, or the like that is to be provided between the circuit board and the plurality of busbars and is provided with an opening for the connection of the electronic component can be used as the solder restricting layer. At this time, the opening can be used as the pattern surrounding the soldering region. Specifically, the end portions forming the opening in the sticky sheet or adhesive sheet can be used as walls for restricting the spread of the solder.

The size of the sticky sheet, adhesive sheet, or the like can be reduced in response to the reduction in size of the circuit board, for example. The opening can be formed in an accurate shape in a plan view. Therefore, the spread of the solder can be restricted with high accuracy when the electronic component is soldered to the busbar, while the size of the circuit assembly can be further reduced. In addition, the spread of the solder can be restricted with high accuracy, and therefore, the electronic component can also be positioned with high accuracy.

The circuit assembly described above may also include a sticky sheet that has insulating properties, is provided between the circuit board and the plurality of busbars, and is stuck to opposed surfaces of the plurality of busbars that are opposed to the circuit board, and have a configuration in which the solder restricting layer is constituted by the sticky sheet, and a sheet opening that is smaller than the connection opening and larger than the soldering region of the busbar in a plan view is formed, as the pattern, in the sticky sheet at a position corresponding to the connection opening of the circuit board.

With this configuration, the solder restricting layer is constituted by a sticky sheet, and the sheet opening that is smaller than the connection opening and larger than the soldering region of the busbar to which the connection terminal is soldered in a plan view is formed, as the pattern, in the sticky sheet at the position corresponding to the connection opening. Therefore, the sheet opening can be used as the pattern surrounding the soldering region. Specifically, the end portions forming the sheet opening in the sticky sheet can be used as walls for restricting the spread of the solder.

The circuit assembly described above may also include an adhesive sheet that has insulating properties, is provided between the circuit board and the plurality of busbars, and adheres the circuit board to the plurality of busbars, and have a configuration in which the solder restricting layer is constituted by the adhesive sheet, and a sheet opening that is smaller than the connection opening and larger than the soldering region of the busbar in a plan view is formed, as the pattern, in the adhesive sheet at a position corresponding to the connection opening of the circuit board.

With this configuration, the solder restricting layer is constituted by an adhesive sheet, and the sheet opening that is smaller than the connection opening and larger than the soldering region of the busbar to which the connection terminal is soldered in a plan view is formed, as the pattern, in the adhesive sheet at the position corresponding to the connection opening. Therefore, also in this case, the sheet opening can be used as the pattern surrounding the soldering region. Specifically, the end portions forming the sheet opening in the adhesive sheet can be used as walls for restricting the spread of the solder.

The circuit assembly described above may have a configuration in which the solder restricting layer is constituted by solder resist films printed on opposed surfaces of the plurality of busbars that are opposed to the electronic component, and the solder resist films are formed as the pattern surrounding the soldering region.

With this configuration, the solder resist films are formed as the pattern surrounding the soldering region of the busbar. The solder resist films lack an affinity for solder. In other words, the solder resist films lack solder wettability. Therefore, the solder resist films can repel solder. As a result, the spread of the solder outward from the soldering region can be restricted by the solder resist films.

An electrical junction box disclosed in this specification includes any one of the circuit assemblies described above, and a case in which the circuit assembly is accommodated.

Advantageous Effects of Invention

With the present invention, the spread of solder can be restricted with high accuracy when an electronic component is soldered to a busbar, while the size of a circuit assembly can be further reduced.

DETAILED DESCRIPTION OF PREFERRED EMBODIMENTS

Embodiment 1

Embodiment 1 will be described with reference to FIGS. 1 to 8.

An electrical junction box 10 is arranged on a power supply path between a power supply, such as a battery of a vehicle, and loads constituted by in-vehicle electrical equipment, such as a lamp and a wiper, for example, and can be used in a DC-DC converter, an inverter, or the like. In the following description, the X direction indicates a "right side", the Y direction indicates a "front side", and the Z direction indicates an "upper side".

1. Electrical Junction Box

Figure 1:
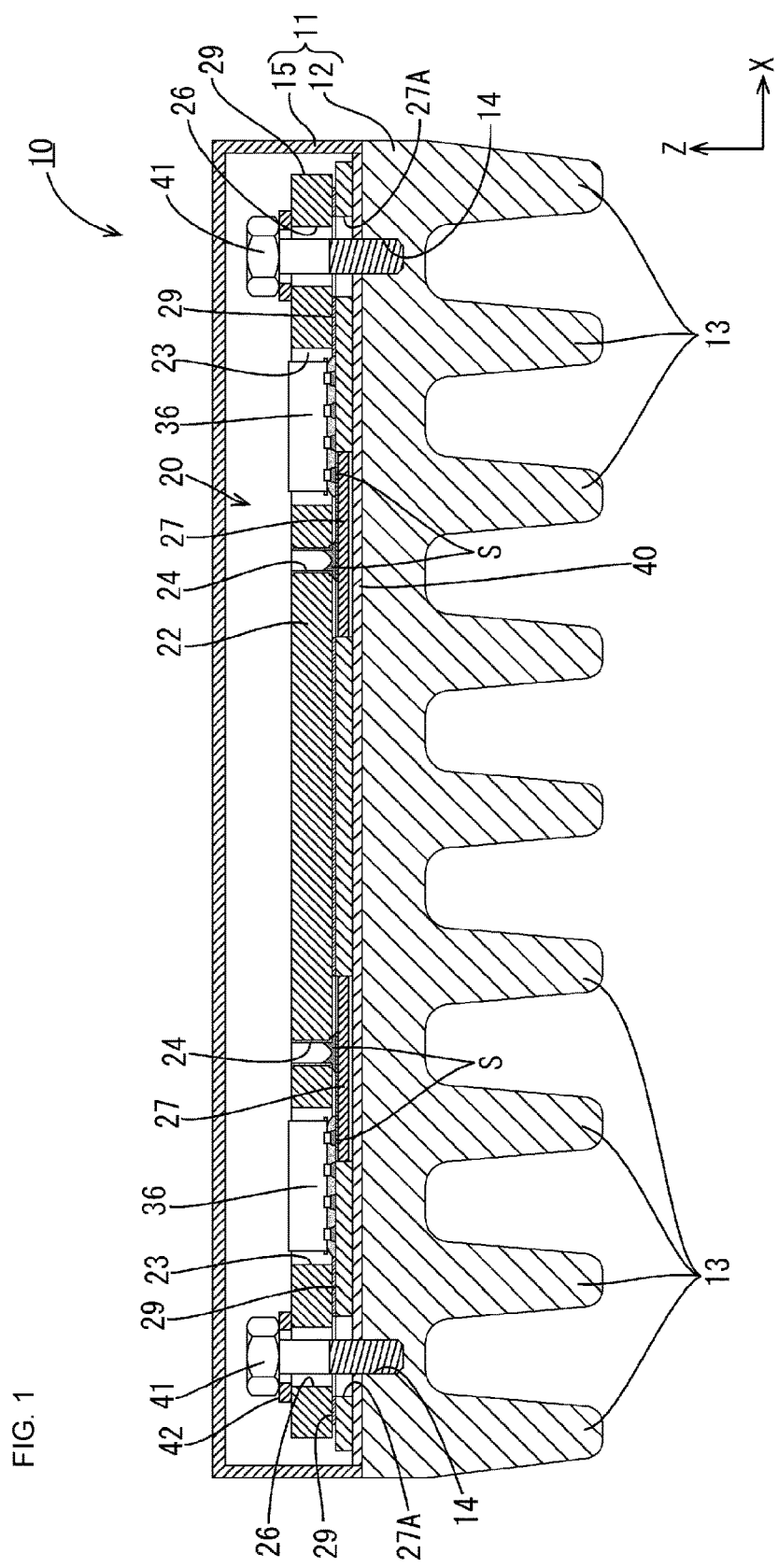
FIG. 1 is a schematic cross-sectional view showing an electrical junction box of Embodiment 1.

As shown in FIG. 1, the electrical junction box 10 includes a circuit assembly 20, and a case 11 in which the circuit assembly 20 is accommodated. The case 11 includes a heat dissipation member 12 on which the circuit assembly 20 is mounted, and a cover 15 that covers the upper side of the circuit assembly 20.

The heat dissipation member 12 is made of a metal material such as an aluminum alloy having a high thermal conductivity, and includes a flat top surface having a size that allows the entirety of a board 21 to be mounted thereon and a plurality of heat dissipation fins 13 lined up like comb teeth on the bottom surface. Screw holes 14 with a thread into which screws 41 are to be screwed are formed in the upper surface of the heat dissipation member 12. The cover 15 is made of a synthetic resin or metal, and is formed in a box shape whose lower side is open.

2. Circuit Assembly

Figure 2:
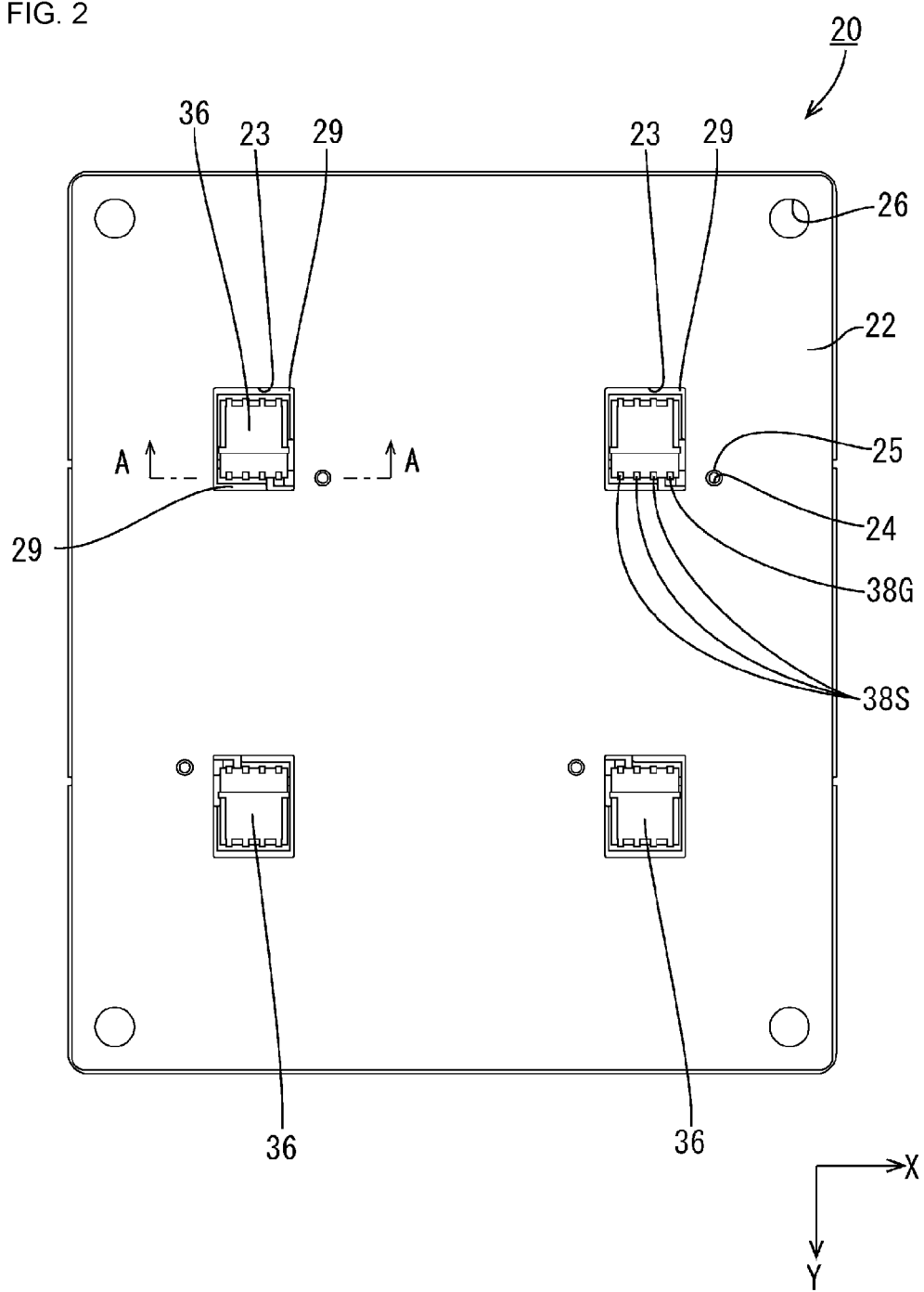
FIG. 2 is a schematic plan view showing a circuit assembly of Embodiment 1.
Figure 3:
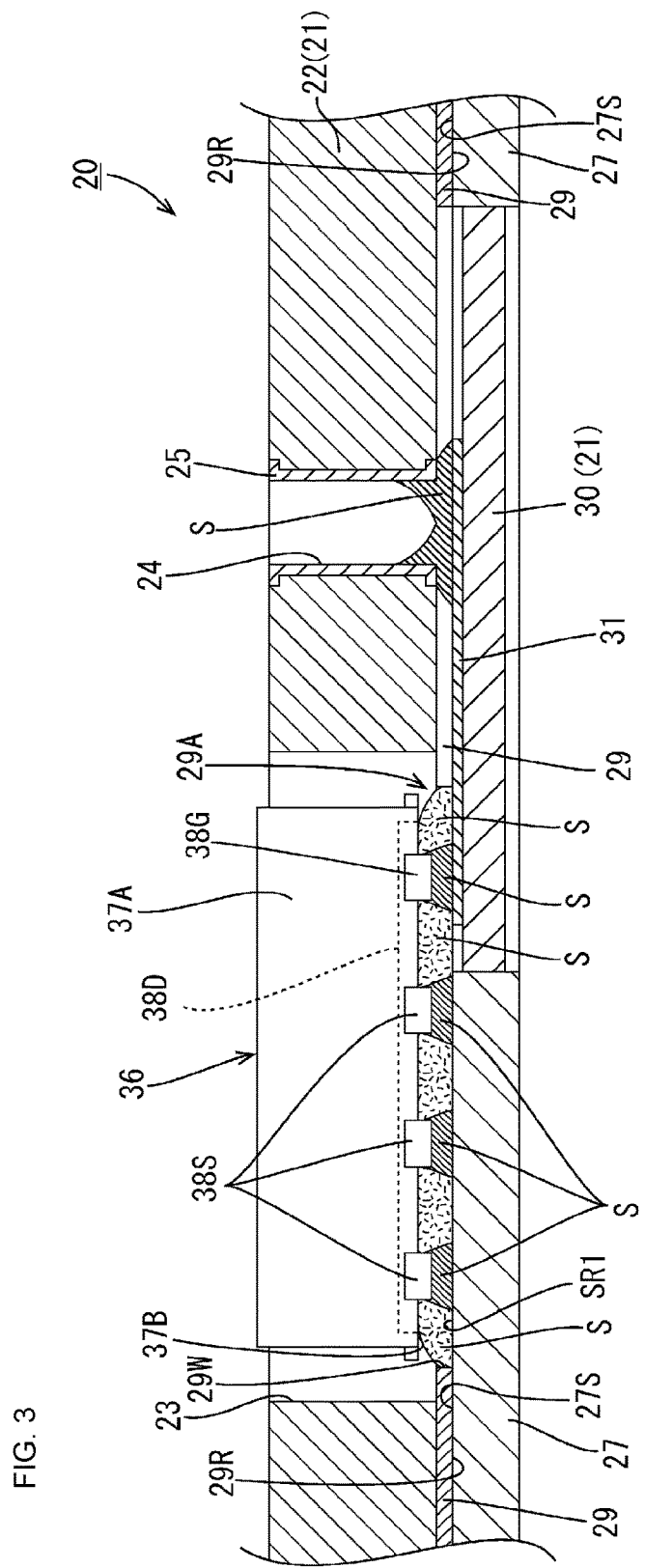
FIG. 3 is a cross-sectional view taken along line A-A in FIG. 2.

As shown in FIGS. 2 and 3, the circuit assembly 20 includes a board 21, and electronic components 36 installed on the board 21. The board 21 includes a first circuit board 22, a plurality of busbars 27 layered on the back surface of the first circuit board 22, and second circuit boards 30 that are layered on the back surface of the first circuit board 22 and arranged on the same level as the plurality of busbars 27.

The first circuit board 22 is an insulating plate made of an insulating material. Conductive paths (not shown) made of a copper foil or the like are formed on the top surface of the first circuit board 22 through printed wiring. Connection openings 23 through which the electronic components 36 are inserted and connected to the corresponding busbars 27, through holes 24, and insertion holes 26 through which the shafts of the screws 41 are passed are formed through the first circuit board 22 (see FIGS. 2 and 7). The back surface of the first circuit board 22 is a surface on a side opposite to the surface on the side from which the electronic components 36 are inserted into the connection openings 23. In other words, the back surface of the first circuit board 22 is a surface on a side opposite to the top surface (front surface) on which the above-mentioned conductive path is formed. The first circuit board 22 is an example of a "circuit board".

Figure 7:
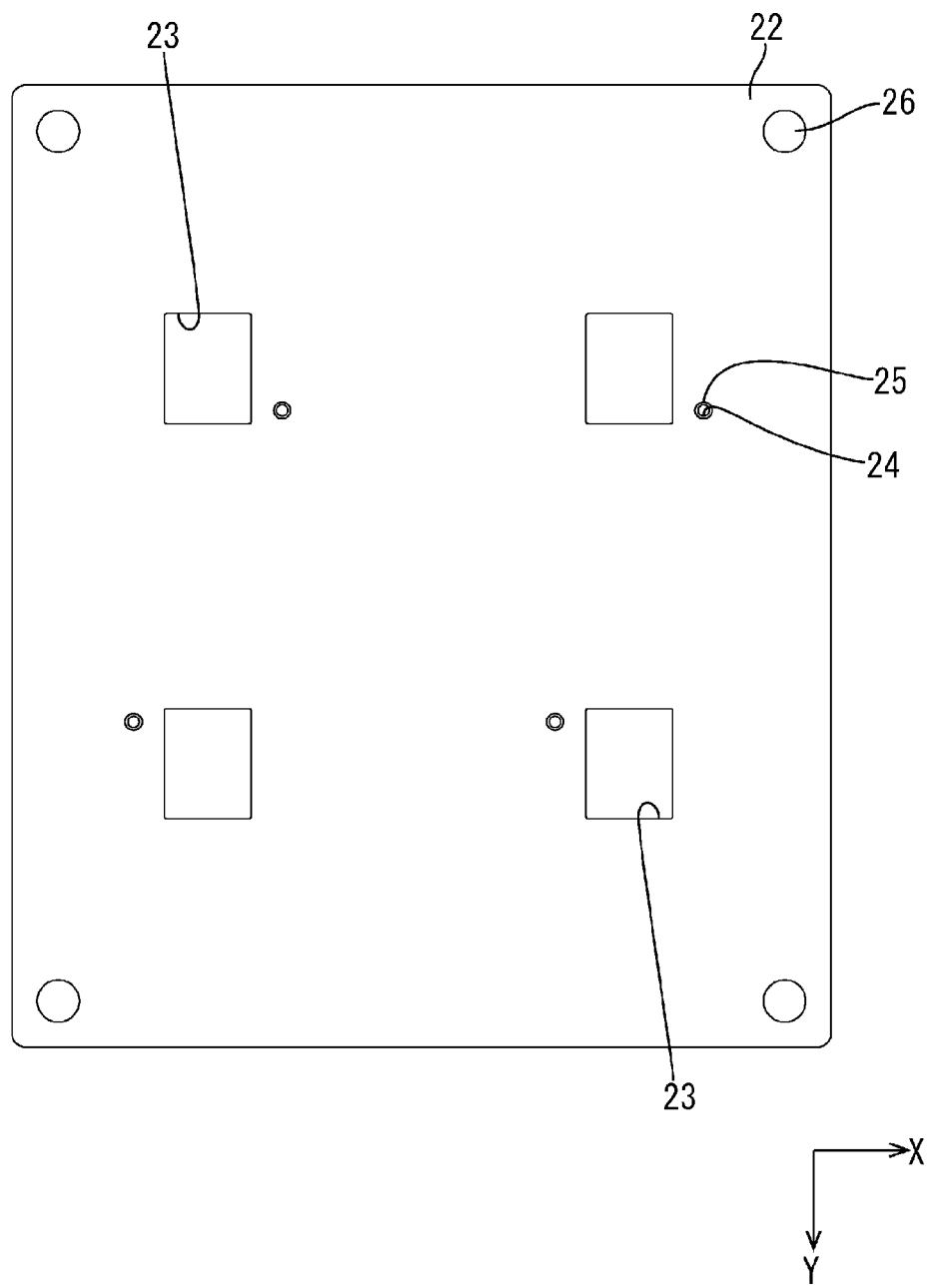
FIG. 7 is a schematic plan view showing a first circuit board.

The connection openings 23 have a rectangular shape, and are formed at a plurality of (four in this embodiment) positions spaced apart from the central portion and peripheral edge portion of the first circuit board 22 (see FIG. 7). The through holes 24 are formed at a plurality of (four in this embodiment) positions that are each located near the connection opening 23 and spaced apart by a predetermined distance therefrom. A conductive relay portion 25 is provided on the inner wall surface and upper and lower opening edge portions of each of the through holes 24. The relay portion 25 is electrically connected to the conductive path on the upper surface (front surface) of the first circuit board 22.

In this embodiment, each of the electronic components 36 is a so-called leadless component, and includes a plurality of N-channel MOSFETs (field effect transistors) that are connected in parallel. Each electronic component 36 (also referred to merely as "MOSFET") includes a main body 37 and a plurality of terminals 38. The plurality of terminals 38 include a drain terminal 38D (an example of the "connection terminal"), a gate terminal 38G, and a plurality of source terminals 38S (examples of the "connection terminal").

The main body 37 has a rectangular parallelepiped shape, and is molded of a sheathing body 37A made of a synthetic resin. The terminals 38S and 38G exposed from the bottom side of the sheathing body 37A are arranged along the bottom surface 37B of the sheathing body 37A. On the other hand, the drain terminal 38D is a plate-shaped terminal having substantially the same size as that of the electronic component 36 in a plan view, and is arranged on the bottom surface 37B of the electronic component 36 and exposed (see FIG. 3).

Figure 4:
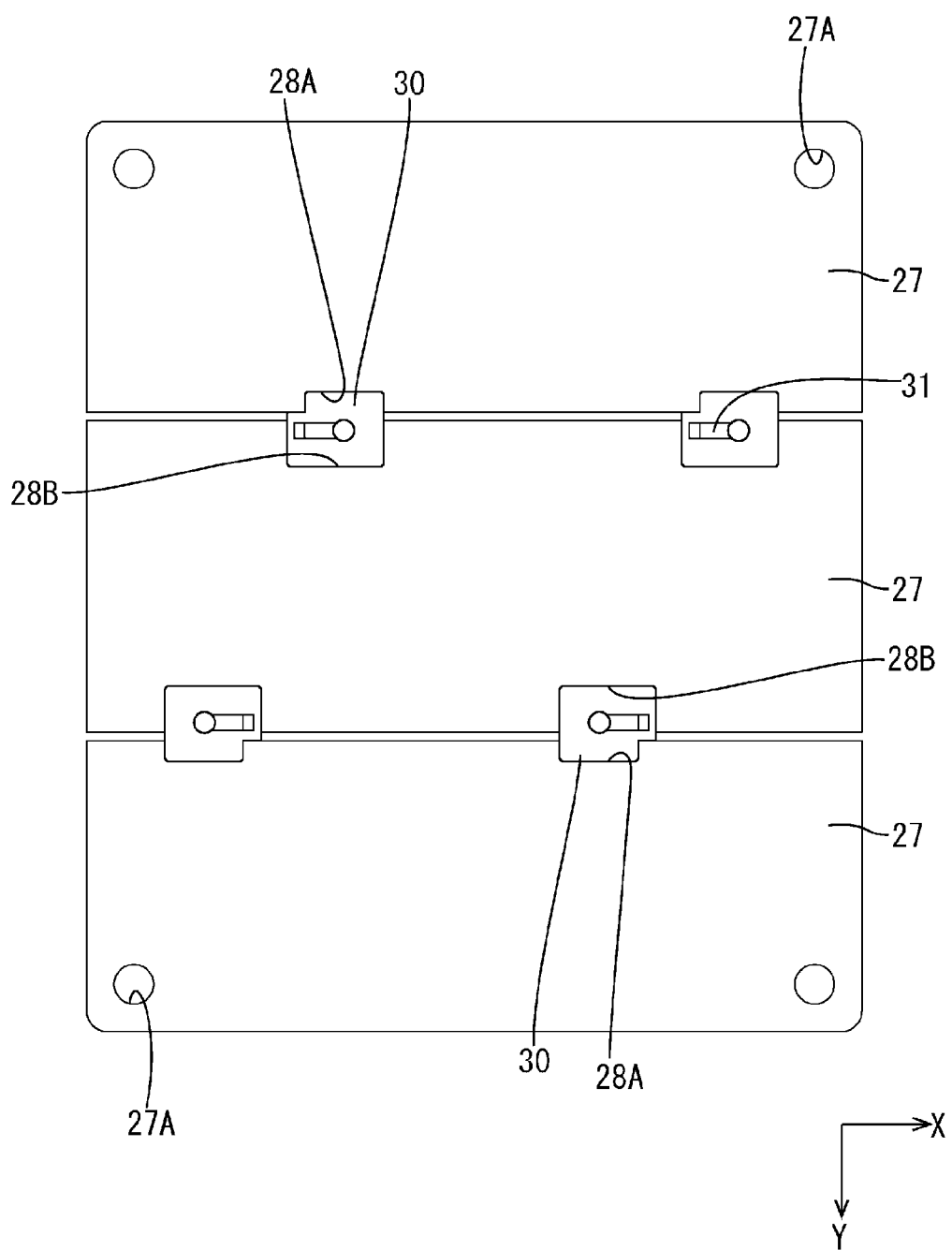
FIG. 4 is a schematic plan view showing a state in which second circuit boards are press-fitted to busbars.
Figure 6:
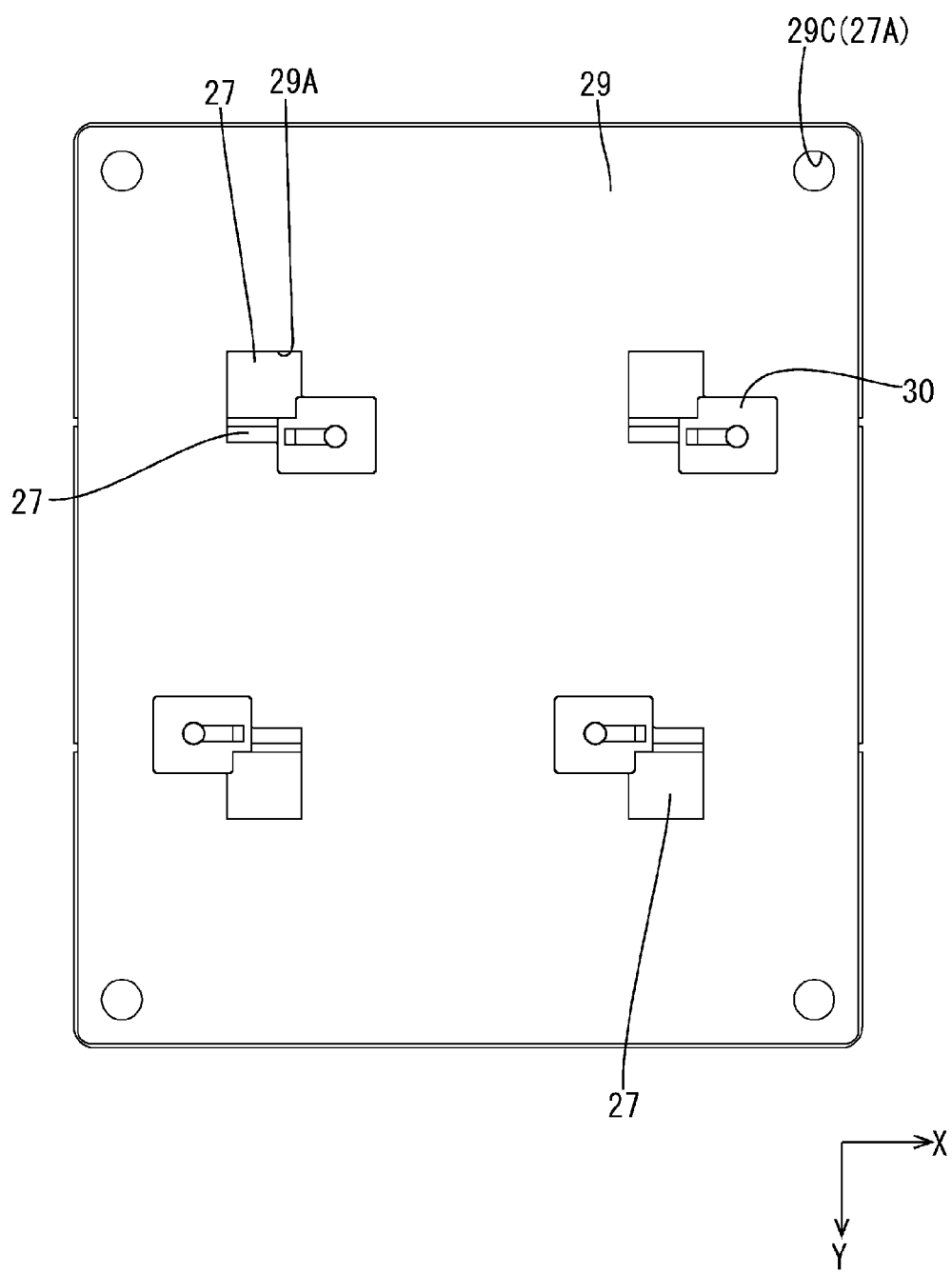
FIG. 6 is a schematic plan view showing a state in which the sticky sheet is stuck to the busbars.

The busbars 27 have a plate shape and are made of metal such as copper or a copper alloy. The busbars 27 are formed by punching metal plates into a shape corresponding to the shape of the conductive path, and are arranged with intervals on the same plane. As shown in FIG. 4, cutout portions 28A and 28B having a shape obtained by cutting the lateral edge of the busbar 27 are formed at the lateral edge of one of the adjacent busbars 27. As shown in FIG. 6, the second circuit boards 30 are press-fitted into these cutout portions 28A and 28B. Insertion holes 27A through which the shafts of the screws 41 are passed are formed through the plurality of busbars 27. Opposed surfaces 27S of the busbars 27 that are opposed to the first circuit board 22 include soldering regions SR1 to which the drain terminal 38D is to be soldered, and soldering regions SR2 to which the plurality of source terminals 38S are to be soldered (see FIG. 8).

A sticky sheet 29 is provided between the first circuit board 22 and the plurality of busbars 27. The sticky sheet 29 has insulating properties, and is stuck to the opposed surfaces 27S of the plurality of busbars 27 that are opposed to the first circuit board 22. It should be noted that, in this embodiment, only a back surface 29R that is opposed to the plurality of busbars 27 is sticky in the sticky sheet 29.

Sheet openings 29A that are each smaller than the connection opening 23 and larger than the soldering regions (SR1 and SR2) of the busbar 27 in a plan view are formed at the positions corresponding to the connection openings 23 of the first circuit board 22 in the sticky sheet 29. The sheet openings 29A are examples of the "pattern surrounding the soldering region of the busbar to which the connection terminal is to be soldered".

In addition, board openings 29B that are each linked to the sheet opening 29A are formed in the sticky sheet 29. Examples of the borders between the sheet openings 29A and the board openings 29B are shown by long dashed double-short dashed lines (imaginary lines) (see FIG. 5). Moreover, insertion holes 29C through which the shafts of the screws 41 are passed are formed through the sticky sheet 29.

Portions of the sticky sheet 29 located at the borders with the sheet openings 29A, in other words, end portions 29W of the sticky sheet 29 that form the sheet openings 29A, are located at peripheral regions that surround the terminals 38D, 38G, and 38S of the MOSFETs 36 to be soldered on the opposed surfaces 27S of the plurality of busbars 27, and form walls against solder S (see FIG. 3). In other words, the sheet openings 29A surround the soldering regions (SR1 and SR2) of the busbars 27. It should be noted that, in this embodiment, the electronic components 36 are soldered by reflow soldering.

The end portions 29W of the sticky sheet 29 restrict the spread of the solder S particularly when the drain terminals 38D of the electronic components 36 are soldered to the corresponding busbars 27 by reflow soldering. Specifically, the drain terminals 38D have a large terminal area, and thus require a large amount of solder when soldered. Therefore, during reflow soldering, the MOSFETs 36 are likely to move with the movement of melted solder S. In this embodiment, in order to restrict such movement of solder during reflow soldering, the openings of the sticky sheet 29 are formed to have an area smaller than normal, so that the sticky sheet 29 is located much closer to the drain terminals 38D of the MOSFETs 36 (see FIG. 3). The sticky sheet 29, which restricts the movement of the solder S in this manner while the MOSFETs 36 are soldered to the busbars 27, is an example of the "solder restricting layer".

The second circuit boards 30 are small boards to which the gate terminals 38G of the MOSFETs 36 are to be connected. Conductive paths 31 made of a copper foil are formed on the upper surfaces of the second circuit boards 30. The conductive paths 31 are connected to the conductive path (not shown) formed on the surface of the first circuit board 22 via the relay portions 25 in the through holes 24. The gate terminals 38G are soldered to the conductive paths 31, and the conductive paths 31 are soldered to the relay portions 25.

3. Method for Manufacturing Electrical Junction Box

Next, a method for manufacturing the electrical junction box 10 will be schematically described with reference to FIGS. 4 to 8.

Figure 5:
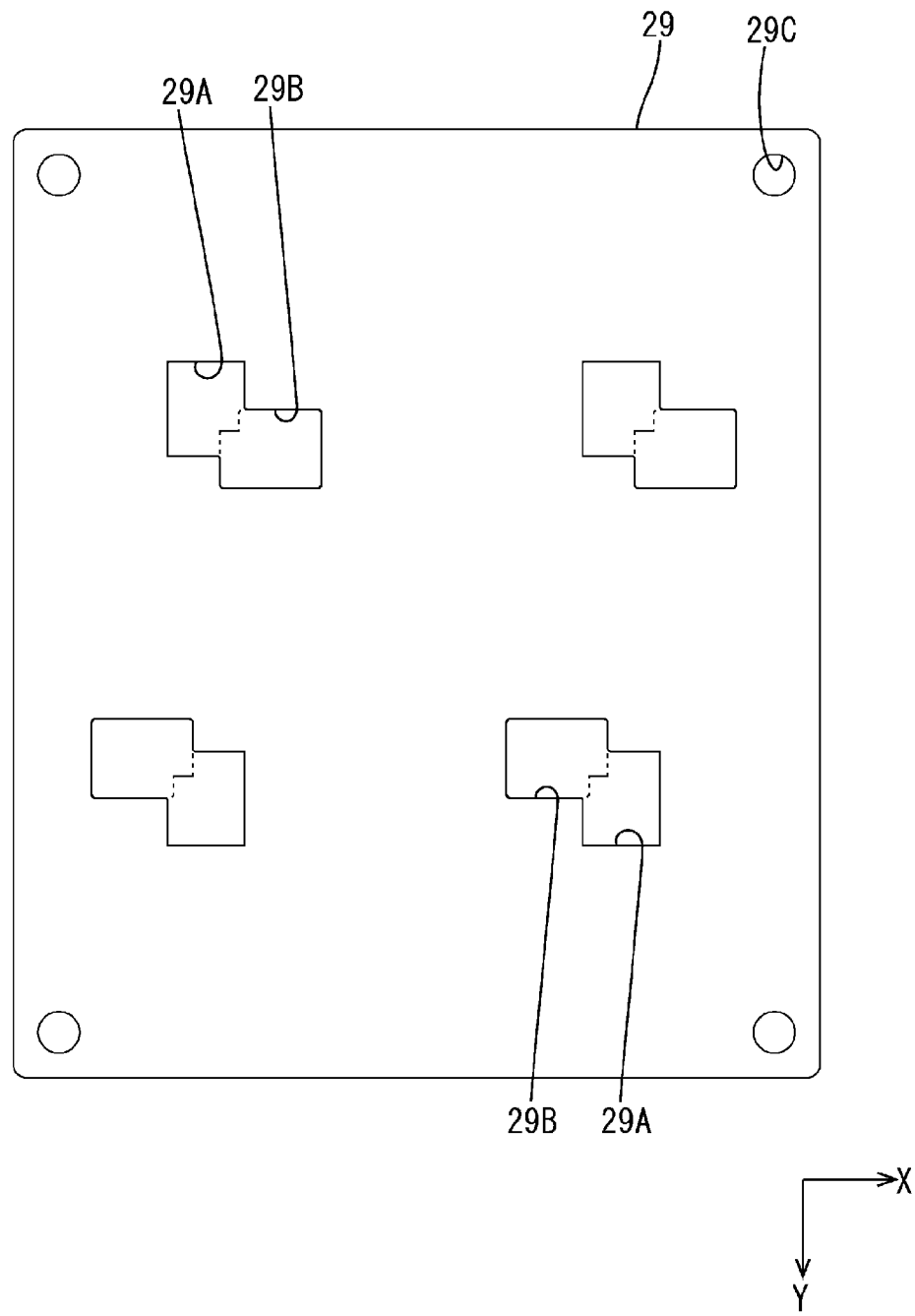
FIG. 5 is a schematic plan view showing a sticky sheet.

As shown in FIG. 4, the busbar 27 with the second circuit boards is formed by press-fitting the second circuit boards 30 into the cutout portions 28A and 28B of the busbar 27. Next, the busbars 27 adjacent to the busbar 27 with the second circuit boards are arranged to come in intimate contact with the second circuit boards 30. Then, the back surface 29R of the sticky sheet 29 shown in FIG. 5 is pressed against and attached to the surfaces (opposed surfaces) 27S of the busbars 27 (see FIG. 6).

Figure 8:
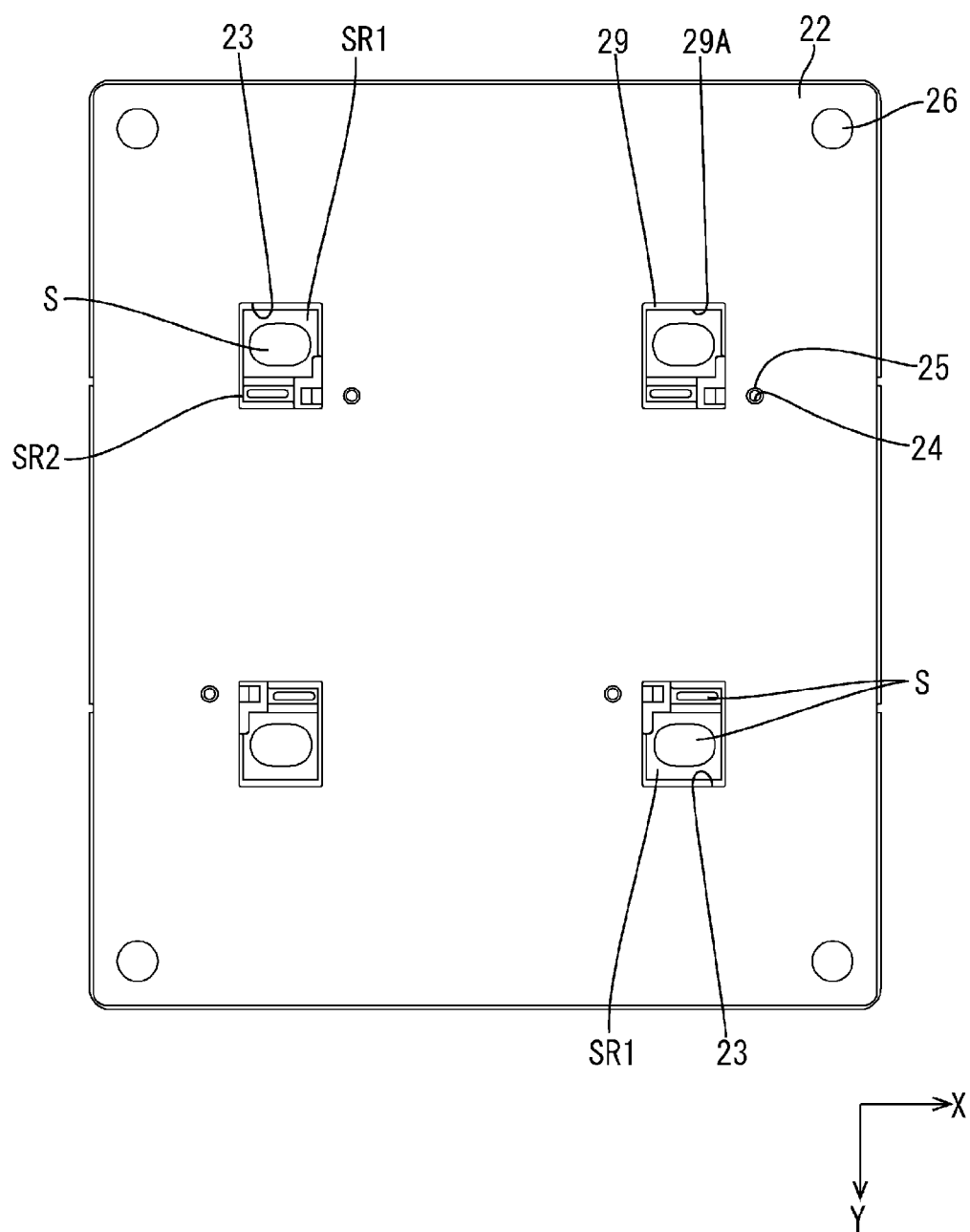
FIG. 8 is a schematic plan view showing a state in which the first circuit board is layered on the sticky sheet.

Next, solder paste S is applied to predetermined positions of the busbars 27 and the second circuit boards 30, and the first circuit board 22 is layered on the sticky sheet 29 (see FIG. 8). Then, the MOSFETs 36 are soldered to the predetermined busbars 27 by being passed through a reflow furnace. As a result, the plurality of terminals 38D, 38G, and 38S of the MOSFETs 36 are soldered to the predetermined busbars 27 with the solder S, and the relay portions 25 are soldered to the conductive paths 31 of the second circuit boards 30 with the solder S. The circuit assembly 20 shown in FIGS. 2 and 3 is thus formed.

Next, the circuit assembly 20 is mounted on the heat dissipation member 12 via an insulating layer 40. The shafts of the screws 41 are passed through washers 42, the insertion holes 26 of the first circuit board 22, the insertion holes 27A of the busbars 27, and the like, and screwed into the screw holes 14 of the heat dissipation member 12, and the circuit assembly 20 is thus fixed to the heat dissipation member 12. Then, the cover 15 is put over the circuit assembly 20, and the electrical junction box 10 shown in FIG. 1 is thus formed.

4. Effects of Embodiment 1

With Embodiment 1 above, when the drain terminals 38D and the source terminals 38S of the MOSFETs 36 are soldered to the soldering regions (SR1 and SR2) of the busbars 27, the spread of the solder S outward from the soldering regions (SR1 and SR2) can be restricted by the sheet openings 29A (patterns) of the sticky sheet 29 (solder restricting layer) surrounding the soldering regions (SR1 and SR2). Specifically, the commonly used sticky sheet 29 that is to be provided between the first circuit board 22 and the plurality of busbars 27 and is provided with the openings 29A for the connection of the electronic components 36 can be used as the solder restricting layer. At this time, the sheet openings 29A can be used as the patterns surrounding the soldering regions (SR1 and SR2). Specifically, the end portions 29W forming the sheet openings 29A in the sticky sheet 29 can be used as walls for restricting the spread of the solder S.

The size of the sticky sheet 29 can be reduced in response to the reduction in size of the first circuit board 22, for example. The sheet openings 29A can be formed in an accurate shape in a plan view. Therefore, the spread of the solder can be restricted with high accuracy when the electronic components 36 are soldered to the busbars 27, while the size of the circuit assembly 20 can be further reduced. In addition, the spread of the solder can be restricted with high accuracy, and therefore, the electronic components 36 can also be positioned with high accuracy.

In Embodiment 1, the solder restricting layer is constituted by the sticky sheet 29, and the sheet openings 29A that are each smaller than the connection opening 23 and larger than the soldering regions (SR1 and SR2) of the busbars to which the drain terminals 38D and the source terminals 38S are soldered in a plan view are formed, as the patterns, in the sticky sheet 29 at the positions corresponding to the connection openings 23 (see FIG. 8). Therefore, the sheet openings 29A can be used as the patterns surrounding the soldering regions (SR1 and SR2).

Embodiment 2

Figure 9:
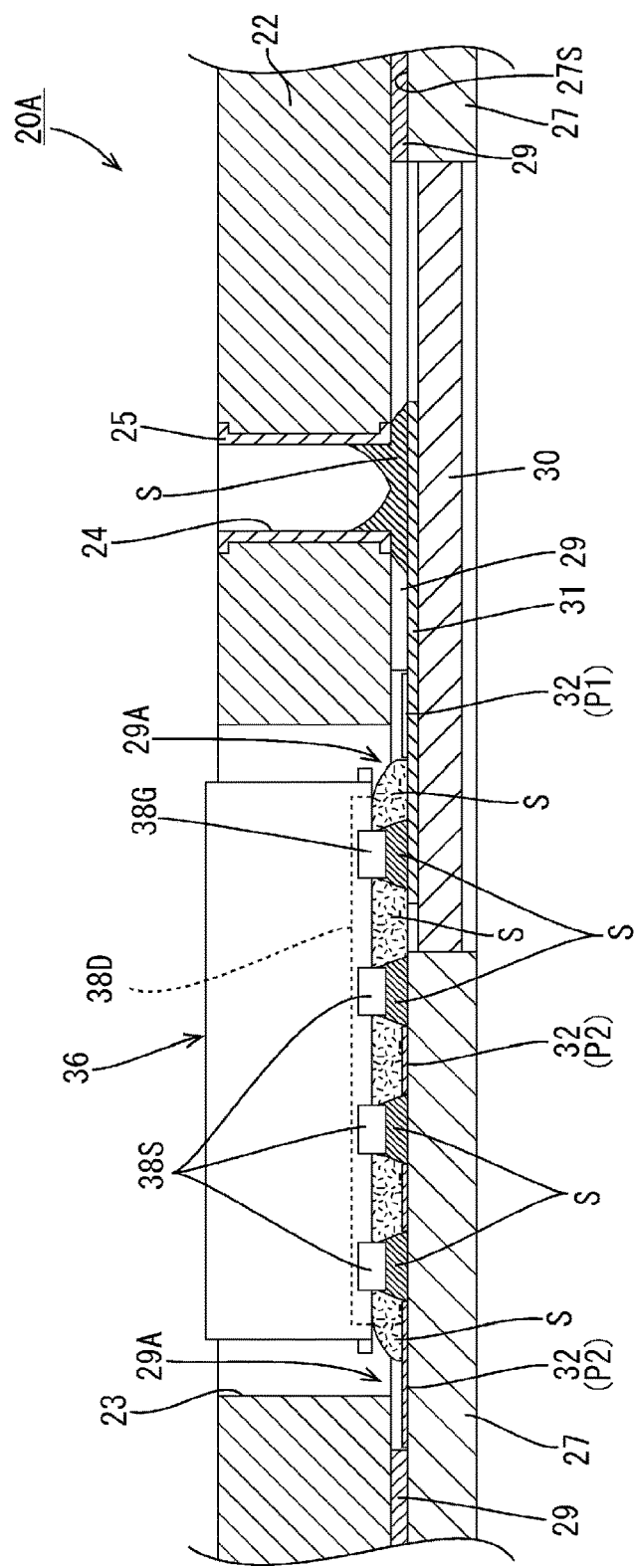
FIG. 9 is a schematic partial cross-sectional view showing a circuit assembly of Embodiment 2.

Next, Embodiment 2 will be described with reference to FIGS. 9 to 13. It should be noted that only structural aspects different from those of Embodiment 1 will be described, and structural aspects identical to those of Embodiment 1 are denoted by identical reference numerals, and the descriptions are omitted. It should be noted that FIG. 9 is a partial cross-sectional view of a portion of a circuit assembly 20A of Embodiment 2 that corresponds to the portion shown in FIG. 3.

In Embodiment 2, the configuration of the solder restricting layer differs from that in Embodiment 1. Specifically, in Embodiment 2, the solder restricting layer is constituted by solder resist films 32 that are printed on the opposed surfaces 27S of the plurality of busbars 27 that are opposed to the electronic components 36. At this time, the solder resist films 32 are formed as the patterns surrounding the soldering regions (SR1 and SR2). The solder resist films 32 are examples of the "pattern surrounding the soldering region of the busbar to which the connection terminal is to be soldered".

Figure 10:
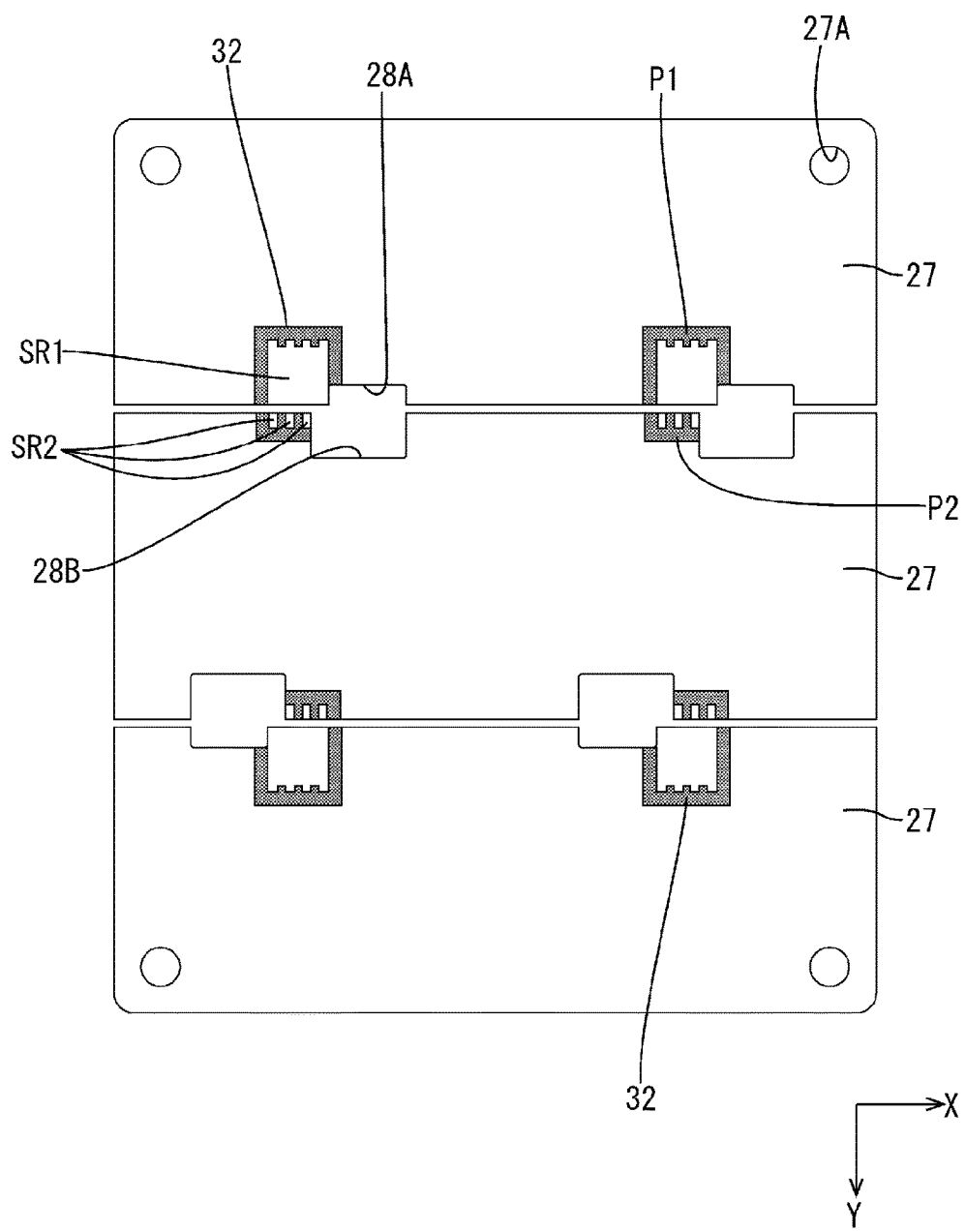
FIG. 10 is a plan view showing a state in which solder resist films are printed on the busbars.

Specifically, as shown in FIG. 10, the solder resist films 32 include first patterns P1 surrounding the soldering regions SR1 to which the drain terminals 38D of the MOSFETs 36 are to be soldered, and second patterns P2 surrounding the soldering regions SR2 to which the source terminals 38S are to be soldered.

Figure 11:
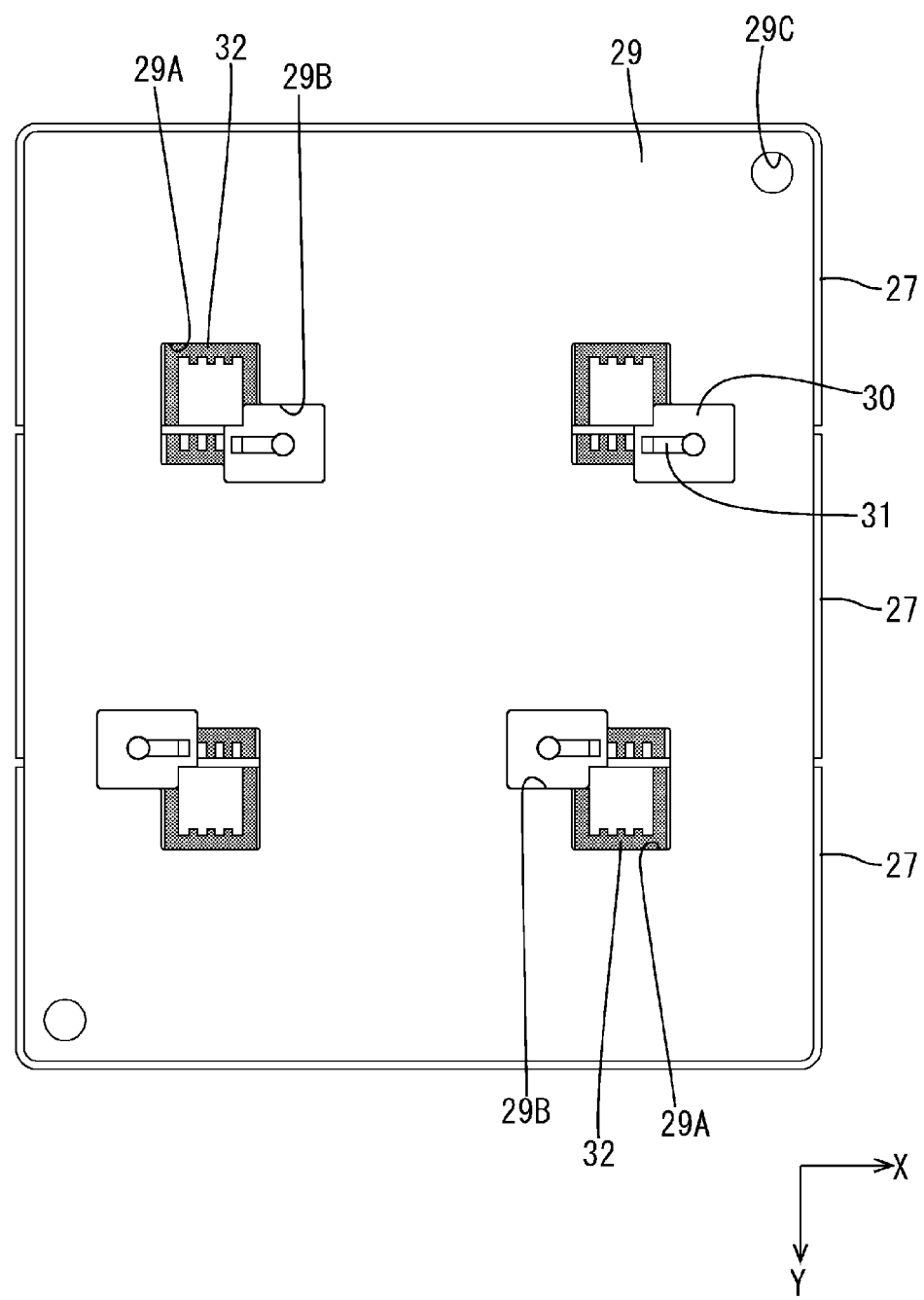
FIG. 11 is a schematic plan view showing a state in which a sticky sheet is stuck to the busbars.
Figure 13:
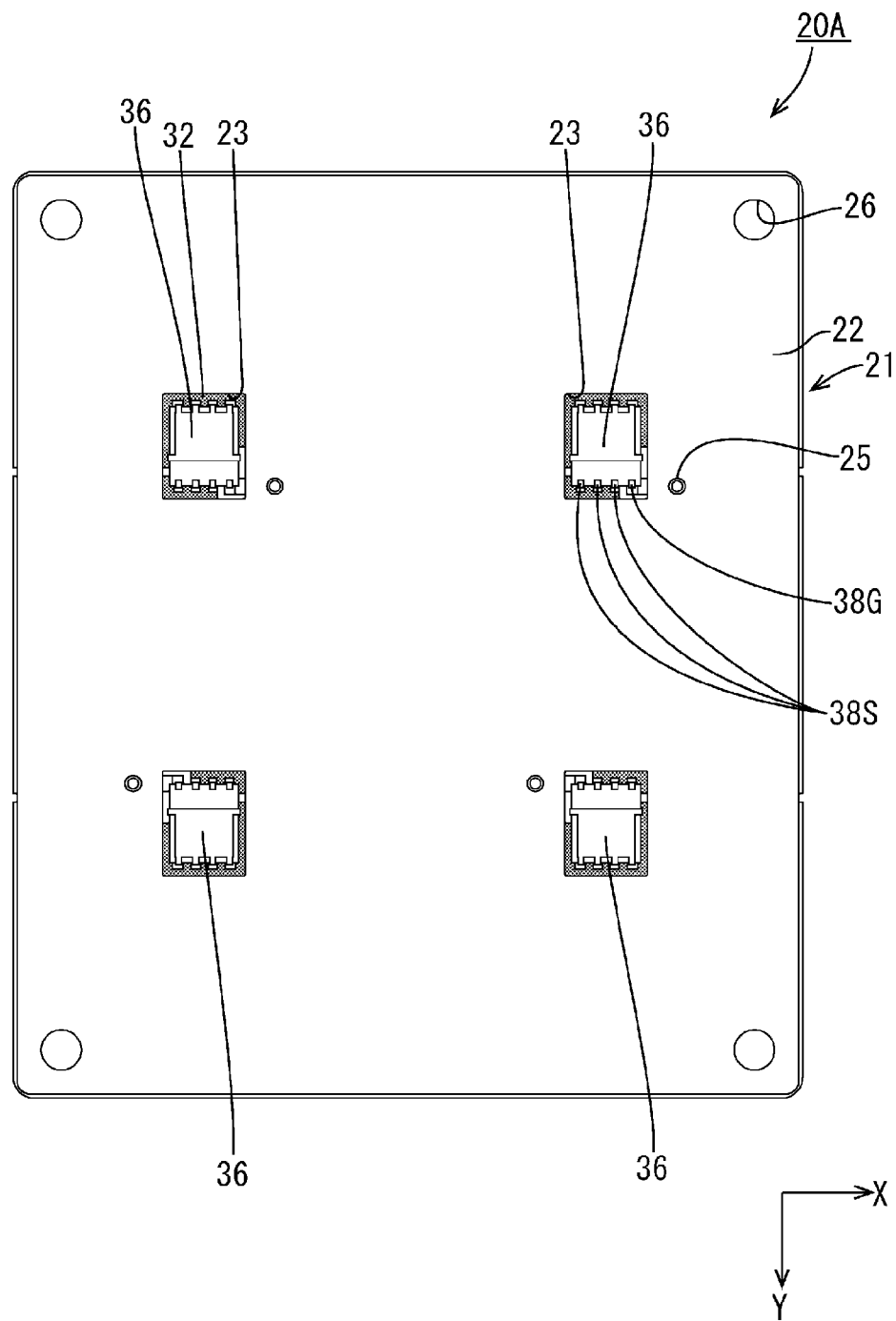
FIG. 13 is a schematic plan view showing the circuit assembly of Embodiment 2.

In Embodiment 2, the sheet openings 29A of the sticky sheet 29 are shaped to be larger than the connection openings 23 in a plan view (see FIGS. 11 and 13).

4. Method for Manufacturing Electrical Junction Box

Next, a method for manufacturing the electrical junction box 10 of Embodiment 2 will be schematically described with reference to FIGS. 10 to 13.

As shown in FIG. 10, the solder resist films 32 serving as the patterns P1 and P2 that respectively surround the soldering regions SR1 and SR2 to which the connection terminals 38 of the MOSFETs 36 are to be soldered are printed and formed on the opposed surfaces 27S of the busbars 27 that are opposed to the MOSFETs 36.

Next, the busbar 27 with the second circuit boards are formed by press-fitting the second circuit boards 30 into the cutout portions 28A and 28B of the busbar 27. Then, the back surface 29R of the sticky sheet 29 is pressed against and attached to the surfaces 27S of the busbars 27 (see FIG. 11).

Figure 12:
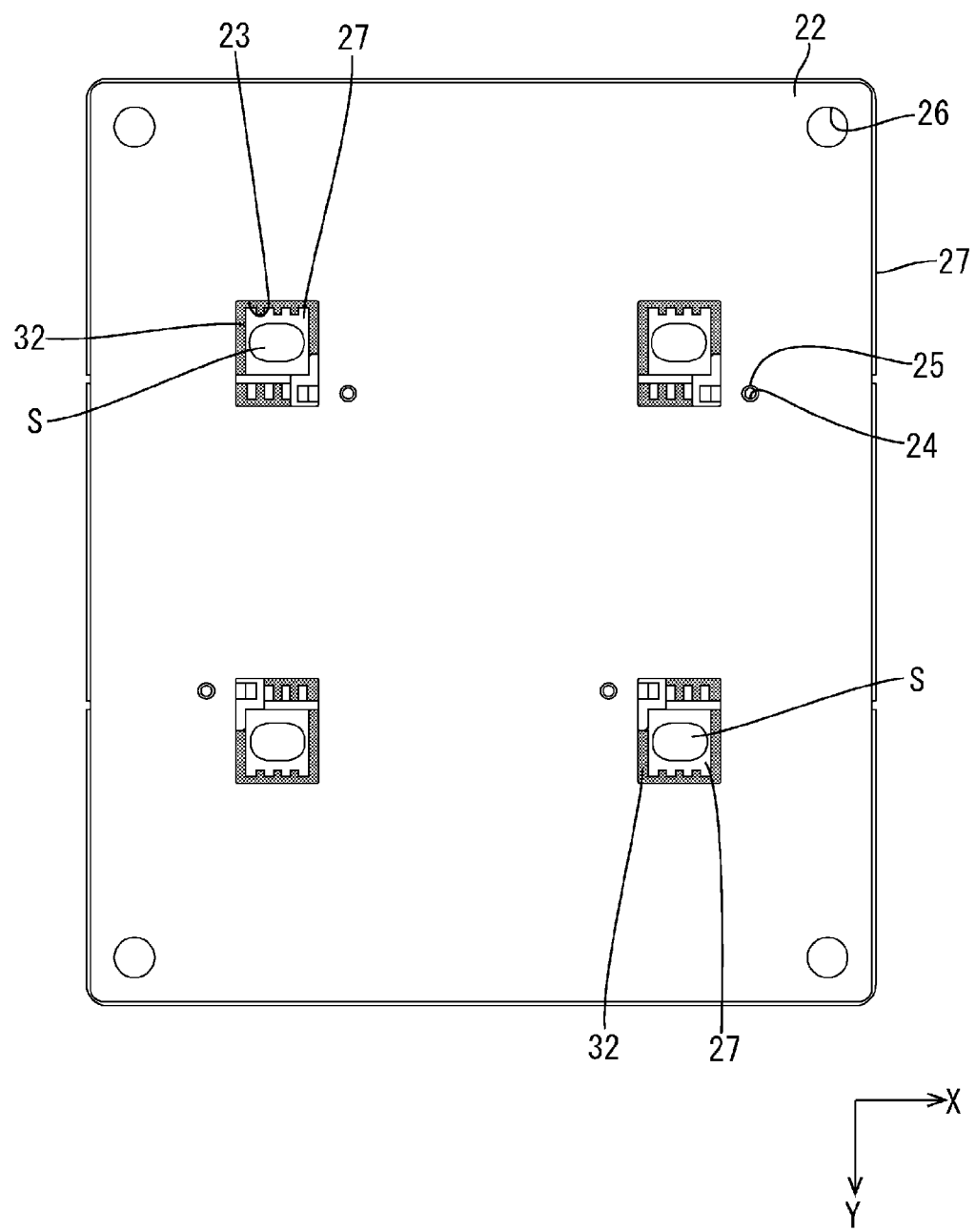
FIG. 12 is a schematic plan view showing a state in which the first circuit board is layered on the sticky sheet.

Next, solder paste S is applied to predetermined positions of the busbars 27 and the second circuit boards 30, and the first circuit board 22 is layered on the sticky sheet 29 (see FIG. 12). Then, the MOSFETs 36 are soldered to the predetermined busbars 27 by being passed through a reflow furnace. As a result, the plurality of terminals 38D, 38G, and 38S of the MOSFETs 36 are soldered to the predetermined busbars 27 with the solder S, and the relay portion 25 are soldered to the conductive paths 31 of the second circuit boards 30 with the solder S. The circuit assembly 20A shown in FIG. 9 is thus formed.

Next, the circuit assembly 20A is mounted on the heat dissipation member 12 via the insulating layer 40 in the same manner as in Embodiment 1. The shafts of the screws 41 are passed through washers 42, the insertion holes 26 of the first circuit board 22, the insertion holes 27A of the busbars 27, and the like, and screwed into the screw holes 14 of the heat dissipation member 12, and the circuit assembly 20A is thus fixed to the heat dissipation member 12. Then, the cover 15 is put over the circuit assembly 20A, and the electrical junction box 10 is thus formed (see FIG. 1).

5. Effects of Embodiment 2

In Embodiment 2, the solder resist films 32 are formed as the patterns surrounding the soldering regions (SR1 and SR2) of the busbars 27. The solder resist films 32 lack an affinity for the solder S. In other words, the solder resist films 32 lack solder wettability. Therefore, the solder resist films 32 can repel solder. As a result, the spread of the solder S outward from the soldering regions (SR1 and SR2) can be restricted by the solder resist films 32.

The solder resist films 32 can be formed with high accuracy depending on the size of the electronic components 36. Therefore, the spread of the solder can be restricted with high accuracy when the electronic components 36 are soldered to the busbars 27, while the size of the circuit assembly 20 can be further reduced. In addition, the spread of the solder can be restricted with high accuracy, and therefore, the electronic components 36 can also be positioned with high accuracy.

Other Embodiments

The present invention is not limited to the embodiments that have been described above with reference to the drawings, and embodiments such as those described below are also included in the technical scope of the present invention, for example.

(1) Although, in Embodiment 1 above, the sticky sheet 29 has a configuration in which only the back surface 29R is sticky (retains a gluing agent), there is no limitation thereto, and the sticky sheet 29 may also have a configuration in which the front surface (surface on the first circuit board side) is also sticky.

The shapes of the sheet openings 29A in a plan view are not limited to the shapes shown in FIG. 5 (larger than the region SR1 and the region SR2 in a plan view). The sheet openings 29A may also be shaped to be smaller than the connection openings 23 and larger than the regions SR1 of the busbars 27 to which only the drain terminals (or source terminals, according to the types of the MOSFETs) are to be soldered in a plan view. In short, it is sufficient if the sheet openings 29A are shaped to be smaller than the connection openings 23 and larger than the regions of the busbars to which the connection terminals of the electronic components are to be soldered in a plan view.

(2) Although the example in which the solder restricting layer is constituted by the sticky sheet 29 is shown in Embodiment 1 above, there is no limitation thereto. The solder restricting layer may also be constituted by an adhesive sheet instead of the sticky sheet 29.

Specifically, the circuit assembly includes an adhesive sheet that has insulating properties, and is arranged between the circuit board and the plurality of busbars 27 to adhere the the circuit board to the plurality of busbars 27. The solder restricting layer may be constituted by the adhesive sheet, and have a configuration in which the sheet openings that are smaller than the connection openings 23 and larger than the soldering regions (SR1 and SR2) of the busbars 27 in a plan view are formed, as the patterns, in the adhesive sheet at the position corresponding to the connection openings 23.

Also in this case, the sheet openings can be used as the patterns surrounding the soldering regions (SR1 and SR2). Specifically, the end portions forming the sheet openings in the adhesive sheet can be used as walls for restricting the spread of the solder S.

(3) Although the configuration in which the second circuit boards 30 are provided and the gate terminals 38G of the MOSFETs 36 are connected to the second circuit boards 30 is shown in the above-described embodiments, there is no limitation thereto. For example, N-channel MOSFETs having a configuration in which only the drain terminal 38D is provided on the back surface and connected to the busbar 27 may also be used as the MOSFETs 36. In this case, the gate terminals 38G and the source terminals 38S are connected to predetermined wirings on the front surface of the first circuit board 22, and therefore, the second circuit boards 30, the through holes 24, and the like are omitted.

The patterns of the solder resist films 32 formed by pattern printing in Embodiment 2 above is not limited to those shown in FIG. 10. For example, the second patterns P2 (solder resist films 32) surrounding the regions R2 to which the source terminals 38S are to be soldered may be omitted. The reason for this is that the amount of solder required for soldering of the source terminals 38S is smaller than the amount of solder required for the drain terminals 38D.

(5) In the above-described embodiments, the electronic components 36 are not limited to the N-channel MOSFETs, and various electronic components can be used. For example, P-channel MOSFETs, mechanical relays, coils, capacitors, or the like may also be used.

The invention claimed is:

1. A circuit assembly comprising:
a circuit board provided with a connection opening;
a plurality of busbars provided on a back surface of the circuit board;
an electronic component provided with a connection terminal that is soldered to the corresponding busbar exposed through the connection opening; and
a solder restricting layer that is provided between the circuit board and the plurality of busbars and includes a pattern surrounding a soldering region of the busbar to which the connection terminal is soldered.

2. The circuit assembly according to claim 1, comprising a sticky sheet that has insulating properties, is provided between the circuit board and the plurality of busbars, and is stuck to opposed surfaces of the plurality of busbars that are opposed to the circuit board,
wherein the solder restricting layer is constituted by the sticky sheet, and
a sheet opening that is smaller than the connection opening and larger than the soldering region of the busbar in a plan view is formed, as the pattern, in the sticky sheet at a position corresponding to the connection opening of the circuit board.

3. The circuit assembly according to claim 1, comprising an adhesive sheet that has insulating properties, is provided between the circuit board and the plurality of busbars, and adheres the circuit board to the plurality of busbars,
wherein the solder restricting layer is constituted by the adhesive sheet, and
a sheet opening that is smaller than the connection opening and larger than the soldering region of the busbar in a plan view is formed, as the pattern, in the adhesive sheet at a position corresponding to the connection opening of the circuit board.

4. The circuit assembly according to claim 1,
wherein the solder restricting layer is constituted by solder resist films printed on opposed surfaces of the plurality of busbars that are opposed to the electronic component, and
the solder resist films are formed as the pattern surrounding the soldering region.

5. An electrical junction box, comprising:
the circuit assembly according to claim 1; and
a case in which the circuit assembly is accommodated.

6. An electrical junction box, comprising:
the circuit assembly according to claim 2; and
a case in which the circuit assembly is accommodated.

7. An electrical junction box, comprising:
the circuit assembly according to claim 3; and
a case in which the circuit assembly is accommodated.

8. An electrical junction box, comprising:
the circuit assembly according to claim 4; and
a case in which the circuit assembly is accommodated.

* * * * *